(12) United States Patent
Lu

(10) Patent No.: US 12,289,957 B2
(45) Date of Patent: Apr. 29, 2025

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Macai Lu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 856 days.

(21) Appl. No.: 17/419,729

(22) PCT Filed: May 27, 2021

(86) PCT No.: PCT/CN2021/096445
§ 371 (c)(1),
(2) Date: Jun. 30, 2021

(87) PCT Pub. No.: WO2022/227167
PCT Pub. Date: Nov. 3, 2022

(65) Prior Publication Data
US 2023/0139990 A1 May 4, 2023

(30) Foreign Application Priority Data
Apr. 27, 2021 (CN) .......................... 202110458047.2

(51) Int. Cl.
*H10K 59/121* (2023.01)
*H01L 27/12* (2006.01)
(Continued)

(52) U.S. Cl.
CPC ......... *H10K 59/1213* (2023.02); *H10K 71/00* (2023.02); *H01L 27/1229* (2013.01); *H01L 27/1248* (2013.01); *H10K 59/1201* (2023.02)

(58) Field of Classification Search
CPC .................................................. H10K 59/1213
See application file for complete search history.

(56) References Cited

U.S. PATENT DOCUMENTS 5,457,553 A * 10/1995 Mori ................. G02F 1/136213
349/39
10,748,938 B2 * 8/2020 Zhou ................... H01L 27/1262
(Continued)

FOREIGN PATENT DOCUMENTS

CN 102646684 A 8/2012
CN 103715226 A 4/2014
(Continued)

*Primary Examiner* — Mounir S Amer
(74) *Attorney, Agent, or Firm* — The Roy Gross Law Firm, LLC; Roy D. Gross

(57) ABSTRACT

A display panel and a manufacturing method are provided. The present disclosure can reduce process steps of the display panel by disposing a first source electrode and a first drain electrode of a low temperature polysilicon thin film transistor and a second source electrode and a second drain electrode of an oxide thin film transistor in a same layer. Therefore, stability of the oxide thin film transistor can be improved, a channel length of the oxide thin film transistor can be shortened correspondingly, resolution of the display panel can be improved, and a thickness of the display panel can be reduced.

13 Claims, 8 Drawing Sheets

(51) Int. Cl.
*H10K 59/12* (2023.01)
*H10K 71/00* (2023.01)

(56) References Cited

U.S. PATENT DOCUMENTS

| | | | |
|---|---|---|---|
| 10,916,185 B1* | 2/2021 | Dai | G09G 3/32 |
| 11,984,451 B2* | 5/2024 | Lee | H01L 21/02164 |
| 2014/0131703 A1* | 5/2014 | Miyamoto | H01L 27/1225 |
| | | | 438/34 |
| 2015/0243793 A1 | 8/2015 | Jeong et al. | |
| 2020/0168638 A1 | 5/2020 | Je et al. | |
| 2021/0335850 A1* | 10/2021 | Zhou | H01L 27/1251 |

FOREIGN PATENT DOCUMENTS

| | | |
|---|---|---|
| CN | 109148491 A | 1/2019 |
| CN | 109841632 A | 6/2019 |
| CN | 111710685 A | 9/2020 |
| CN | 111771283 A | 10/2020 |
| CN | 111863837 A | 10/2020 |

\* cited by examiner

DISPLAY PANEL AND MANUFACTURING METHOD THEREOF

CROSS REFERENCE TO RELATED APPLICATION

This application is a National Phase of PCT Patent Application No. PCT/CN2021/096445 having International filing date of May 27, 2021, which claims the benefit of priority of Chinese Patent Application No. 202110458047.2, filed Apr. 27, 2021, the contents of which are all incorporated herein by reference in their entirety

FIELD OF INVENTION

The present disclosure relates to the field of display technologies, and more particularly, to a display panel and a manufacturing method thereof.

BACKGROUND OF INVENTION

Organic light-emitting diode (OLED) display panels are widely used due to self-illumination and being able to realize flexible displays. In a driving process of display panels, at least two thin film transistors will be used to control pixels to display, and in order to reduce power consumption of the display panels, low temperature polysilicon thin film transistors are used as drive transistors, and oxide thin film transistors are used as transistors for controlling electrical potentials of capacitors. However, in the display panels using the low temperature polysilicon thin film transistors and the oxide thin film transistors, since the low temperature polysilicon thin film transistors and the oxide thin film transistors need to be separately manufactured, process steps of the display panels are more, thereby affecting stability of the oxide thin film transistors and causing the display panels to have poor display.

Therefore, current manufacturing methods of the display panels have a technical problem of the process steps being more.

Technical problem: an embodiment of the present disclosure provides a display panel and a manufacturing method thereof to solve the technical problem of the process steps being more in the current manufacturing methods of the display panels.

SUMMARY OF INVENTION

To solve the above problems, an embodiment of the present disclosure provides following technical solutions.

An embodiment of the present disclosure provides a display panel, which includes:
a plurality of gate lines and data lines arranged crosswise and insulated from each other to form a plurality of sub-pixels arranged in an array, wherein, each of the sub-pixels is at least provided with a first thin film transistor, a second thin film transistor, a pixel capacitor, a power supply terminal, and a light-emitting unit;
wherein, the first thin film transistor includes a low temperature polysilicon thin film transistor, the low temperature polysilicon thin film transistor includes a first gate electrode, a first source electrode, and a first drain electrode, the first gate electrode is connected to the pixel capacitor, and the first source electrode is connected to the power supply terminal, and the first drain electrode is connected to the light-emitting unit;
the second thin film transistor includes an oxide thin film transistor, the oxide thin film transistor includes a second gate electrode, a second source electrode, and a second drain electrode, the second gate electrode is connected to the gate lines, the second source electrode is connected to the data lines, and the second drain electrode is connected to the first gate electrode; and
the first source electrode, the first drain electrode, the second source electrode, and the second drain electrode are disposed in a same layer, and the first source electrode and the first drain electrode are insulated from the second source electrode and the second drain electrode.

In some embodiments, the display panel further includes a substrate, the low temperature polysilicon thin film transistor includes a first active layer disposed on the substrate, the first gate electrode is disposed on one side of the first active layer, the first source electrode and the first drain electrode are disposed on one side of the first active layer away from the substrate, and the first source electrode and the first drain electrode are connected to the first active layer.

In some embodiments, the oxide thin film transistor includes a second active layer disposed on the substrate, the second gate electrode is disposed on one side of the second active layer away from the substrate, the second source electrode and the second drain electrode are disposed under the second active layer, and the second gate electrode is disposed on the side of the second active layer away from the second source electrode.

In some embodiments, the display panel further includes:
a first insulating layer disposed on the first source electrode and the first drain electrode; and
a second insulating layer disposed on the second source electrode and the second drain electrode;
wherein, the first insulating layer and the second insulating layer are separately provided.

In some embodiments, the display panel further includes:
a first gate insulating layer disposed on the side of the first active layer away from the substrate;
a first gate electrode layer disposed on one side of the first gate insulating layer away from the first active layer, wherein, the first gate electrode layer includes the first gate electrode;
an interlayer insulating layer disposed on one side of the first gate electrode layer away from the first gate insulating layer;
a source and drain electrode layer disposed on one side of the interlayer insulating layer away from the first gate electrode layer;
a first passivation layer disposed on one side of the source and drain electrode layer away from the interlayer insulating layer;
the second active layer disposed on one side of the first passivation layer away from the source and drain electrode layer;
a second gate insulating layer disposed on one side of the second active layer away from the first passivation layer;
a second gate electrode layer disposed on one side of the second gate insulating layer away from the second active layer, wherein, the second gate electrode layer includes the second gate electrode and the gate lines; and
a second passivation layer disposed on one side of the second gate electrode layer away from the second gate insulating layer;

wherein, the source and drain electrode layer includes the first source electrode, the first drain electrode, the second source electrode, the second drain electrode, and the data lines.

In some embodiments, the first passivation layer is disposed on the first source electrode and the first drain electrode and extends above the second source electrode and the second drain electrode.

In some embodiments, a projection of the second gate electrode on the substrate and a projection of the second source electrode and the second drain electrode on the substrate have an overlapping portion, and an area of the overlapping portion is greater than or equal to a threshold value.

In some embodiments, the threshold value is 2 μm.

In some embodiments, the display panel further includes a buffer layer disposed between the substrate and the first active layer.

In some embodiments, a material of the buffer layer includes silicon oxide, silicon nitride, silicon oxynitride, a laminate of silicon oxide and silicon nitride, or a mixed material.

In some embodiments, a material of the first active layer includes polysilicon.

In some embodiments, a material of the first gate electrode layer includes molybdenum, a laminate of molybdenum/aluminum, a laminate of molybdenum/copper, a laminate of molybdenum-titanium alloy/copper, a laminate of titanium/aluminum/titanium, a laminate of titanium/copper/titanium, a laminate of molybdenum/copper/indium zinc oxide, a laminate of indium zinc oxide/copper/indium zinc oxide, a laminate of molybdenum/copper/indium tin oxide, a laminate of nickel/copper/nickel, a laminate of molybdenum-nickel-titanium alloy/copper/molybdenum-nickel-titanium alloy, nickel-chromium alloy/copper/nickel-chromium alloy, titanium-nickel alloy/copper/titanium-nickel alloy, a laminate of titanium-chromium alloy/copper/titanium-chromium alloy, or niobium-copper alloy.

In some embodiments, the low temperature polysilicon thin film transistor includes N-type transistors and P-type transistors.

In some embodiments, a material of the interlayer insulating layer includes silicon oxide, silicon nitride, or silicon oxynitride.

In some embodiments, a material of the source and drain electrode layer includes molybdenum, a laminate of molybdenum/aluminum, a laminate of molybdenum/copper, a laminate of molybdenum-titanium alloy/copper, a laminate of molybdenum-titanium alloy/copper/molybdenum-titanium alloy, a laminate of titanium/aluminum/titanium, a laminate of titanium/copper/titanium, a laminate of molybdenum/copper/indium zinc oxide, a laminate of indium zinc oxide/copper/indium zinc oxide, a laminate of molybdenum/copper/indium tin oxide, a laminate of nickel/copper/nickel, a laminate of molybdenum-nickel-titanium alloy/copper/molybdenum-nickel-titanium alloy, nickel-chromium alloy/copper/nickel-chromium alloy, titanium-nickel alloy/copper/titanium-nickel alloy, a laminate of titanium-chromium alloy/copper/titanium-chromium alloy, or niobium-copper alloy.

In some embodiments, a material of the first passivation layer includes silicon oxide, a laminate of silicon oxide/silicon nitride, or a laminate of aluminum oxide/silicon oxide.

In some embodiments, a material of the second active layer includes indium gallium zinc oxide, indium gallium tin oxide, indium gallium oxide, indium zinc oxide, zinc aluminum oxide, or zinc aluminum tin oxide.

In some embodiments, the pixel capacitor includes a first electrode plate and a second electrode plate, the first electrode plate and the first gate electrode are disposed in a same layer, and the second electrode plate and the second gate electrode are disposed in another same layer.

In some embodiments, the pixel capacitor includes a first electrode plate and a second electrode plate, the first electrode plate and the second source electrode are disposed in a same layer, and the second electrode plate and the second gate electrode are disposed in another same layer.

Meanwhile, an embodiment of the present disclosure provides a manufacturing method of the display panel. The manufacturing method of the display panel includes following steps:

disposing the first active layer on the substrate;

disposing the first gate insulating layer on the first active layer;

disposing the first gate electrode layer on the first gate insulating layer, wherein, the first gate electrode layer includes the first gate electrode;

disposing the interlayer insulating layer on the first gate electrode layer and etching the interlayer insulating layer to form first through-holes;

disposing the source and drain electrode layer on the interlayer insulating layer and patterning the source and drain electrode layer to form the first source electrode, the first drain electrode, the second source electrode, the second drain electrode, and the data lines, wherein, the first source electrode and the first drain electrode are connected to the first active layer by the first through-holes;

disposing the first passivation layer on the source and drain electrode layer and etching the first passivation layer to form second through-holes;

disposing the second active layer on the first passivation layer, wherein, the second source electrode and the second drain electrode are connected to the second active layer by the second through-holes;

disposing the second gate insulating layer, the second gate electrode, and the gate lines on the second active layer;

disposing the second passivation layer on the second gate electrode and etching the second passivation layer to form a third through-hole; and disposing a pixel electrode layer on the second passivation layer and patterning the pixel electrode layer to form a pixel electrode, wherein, the pixel electrode is connected to the first source electrode by the third through-hole.

Beneficial effect: the present disclosure provides the display panel and the manufacturing method thereof. The display panel includes the gate lines and data lines arranged crosswise and insulated from each other to form the plurality of sub-pixels arranged in an array, wherein, each of the sub-pixels is at least provided with the first thin film transistor, the second thin film transistor, the pixel capacitor, the power supply terminal, and the light-emitting unit; wherein, the first thin film transistor includes the low temperature polysilicon thin film transistor, the low temperature polysilicon thin film transistor includes the first gate electrode, the first source electrode, and the first drain electrode, the first gate electrode is connected to the pixel capacitor, and the first source electrode is connected to the power supply terminal, and the first drain electrode is connected to the light-emitting unit; the second thin film transistor includes the oxide thin film transistor, the oxide thin film transistor includes the second gate electrode, the second source electrode, and the second drain electrode, the second gate electrode is connected to the gate lines, the second source electrode is connected to the data lines, and the second drain electrode is connected to the first gate electrode; and the first source electrode, the first drain electrode, the second source electrode, and the second drain electrode are disposed in the same layer, and the first source electrode and the first drain electrode are insulated from the second source electrode and the second drain electrode. The present disclosure can reduce process steps of the display panel when disposing the low temperature polysilicon thin film transistor and the oxide thin film transistor by disposing the first source electrode and the first drain electrode of the low temperature polysilicon thin film transistor and the second source electrode and the second drain electrode of the oxide thin film transistor in the same layer. Therefore, stability of the oxide thin film transistor can be improved, a channel length of the oxide thin film transistor can be shortened correspondingly, resolution of the display panel can be improved, and the display panel can be prevented from having poor display. In addition, since the first source electrode, the first drain electrode, the second source electrode, and the second drain electrode are disposed in the same layer, a thickness of the display panel can be reduced.

DESCRIPTION OF DRAWINGS

The following detailed description of specific embodiments of the present disclosure will make the technical solutions and other beneficial effects of the present disclosure obvious with reference to the accompanying drawings.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

Regarding to current manufacturing methods of display panels having a technical problem of process steps being more, an embodiment of the present disclosure provides a display panel and a manufacturing method thereof to solve the technical problem.

Figure 1:
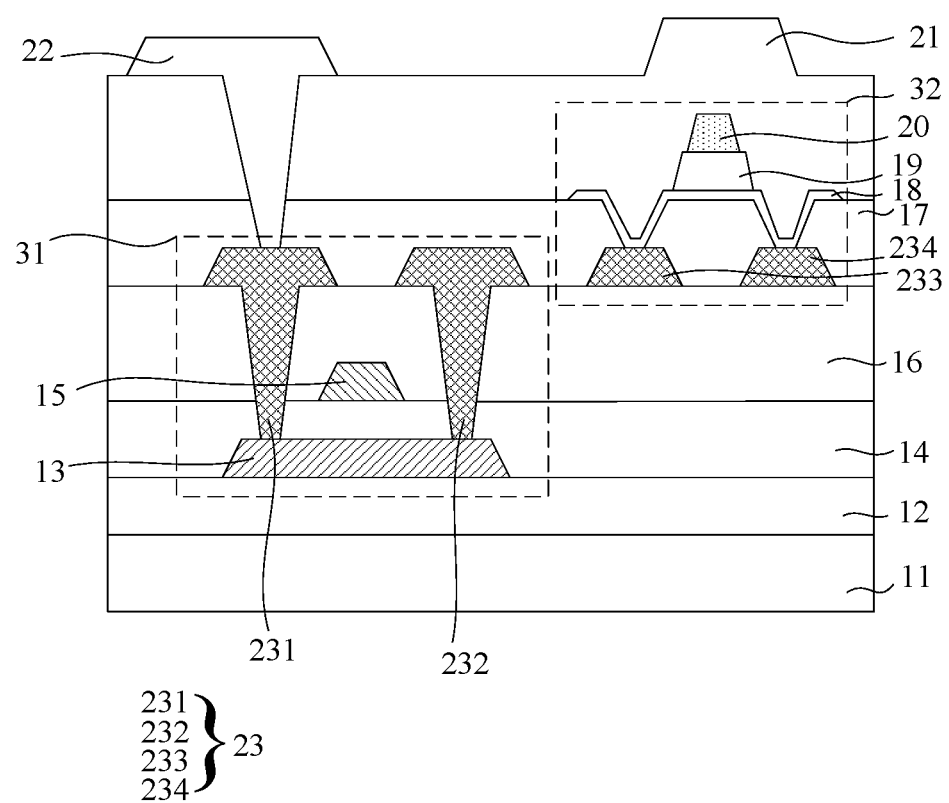
FIG. 1 is a schematic diagram of a display panel according to an embodiment of the present disclosure.
Figure 2:
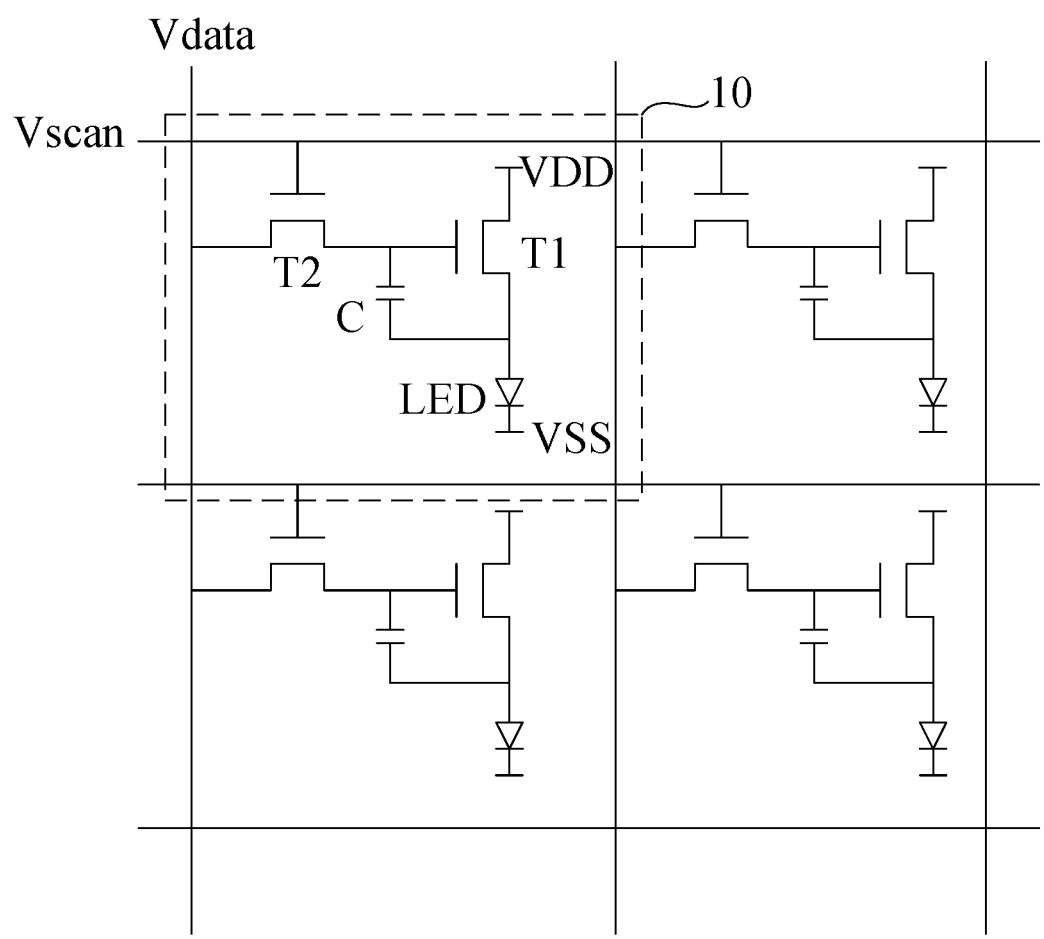
FIG. 2 is a first schematic circuit diagram of the display panel according to an embodiment of the present disclosure.

As shown in FIGS. 1 and 2, an embodiment of the present disclosure provides the display panel, which includes a plurality of gate lines Vscan and data lines Vdata arranged crosswise and insulated from each other to form a plurality of sub-pixels 10 arranged in an array. Wherein, each of the sub-pixels 10 is at least provided with a first thin film transistor T1, a second thin film transistor T2, a pixel capacitor C, a power supply terminal VDD, and a light-emitting unit LED.

The first thin film transistor T1 includes a low temperature polysilicon thin film transistor 31, the low temperature polysilicon thin film transistor 31 includes a first gate electrode 15, a first source electrode 231, and a first drain electrode 232, the first gate electrode 15 is connected to the pixel capacitor C, and the first source electrode 231 is connected to the power supply terminal VDD, and the first drain electrode 232 is connected to the light-emitting unit LED.

The second thin film transistor T2 includes an oxide thin film transistor 32, the oxide thin film transistor 32 includes a second gate electrode 20, a second source electrode 233, and a second drain electrode 234, the second gate electrode 20 is connected to the gate lines Vscan, the second source electrode 233 is connected to the data lines Vdata, and the second drain electrode 234 is connected to the first gate electrode 15.

Wherein, the first source electrode 231, the first drain electrode 232, the second source electrode 233, and the second drain electrode 234 are disposed in a same layer, and the first source electrode 231 and the first drain electrode 232 are insulated from the second source electrode 233 and the second drain electrode 234.

This embodiment provides the display panel. The present disclosure can reduce process steps of the display panel when disposing the low temperature polysilicon thin film transistor and the oxide thin film transistor by disposing the first source electrode and the first drain electrode of the low temperature polysilicon thin film transistor and the second source electrode and the second drain electrode of the oxide thin film transistor in the same layer. Therefore, stability of the oxide thin film transistor can be improved, a channel length of the oxide thin film transistor can be shortened correspondingly, resolution of the display panel can be improved, and the display panel can be prevented from having poor display.

It should be noted that the first source electrode and the first drain electrode being insulated from the second source electrode and the second drain electrode means that the first source electrode is insulated from the second source electrode and the second drain electrode, and the first drain electrode is insulated from the second source electrode and the second drain electrode. The first source electrode and the first drain electrode of the low temperature polysilicon thin film transistor are conducted to each other when realizing functions of transistors, and the second source electrode and the second drain electrode of the oxide thin film transistor are conducted to each other when realizing functions of transistors.

It should be noted that a signal terminal VSS may be a negative electrode of a power supply or a ground terminal.

In an embodiment, the low temperature polysilicon thin film transistor is configured to drive the light-emitting unit to emit light, and the oxide thin film transistor is configured to control an electrical potential of a capacitor.

In an embodiment, each of the sub-pixels includes the first thin film transistor, the second thin film transistor, the pixel capacitor, the power supply terminal, and the light-emitting unit. When a scanning line and one of the data lines provide a high electrical potential, the second gate electrode of the second thin film transistor is turned on, a data voltage provided by the one of the data lines charges the pixel capacitor by the second thin film transistor and turns on the first gate electrode of the first thin film transistor, and the first thin film transistor outputs a current to the light-emitting unit to allow the light-emitting unit to emit light according to a power supply voltage and the data voltage. When the scanning line has a low electrical potential, the pixel capacitor continuously provides a voltage to the first gate electrode of the first thin film transistor, thereby allowing the light-emitting unit to continuously emit light.

Figure 3:
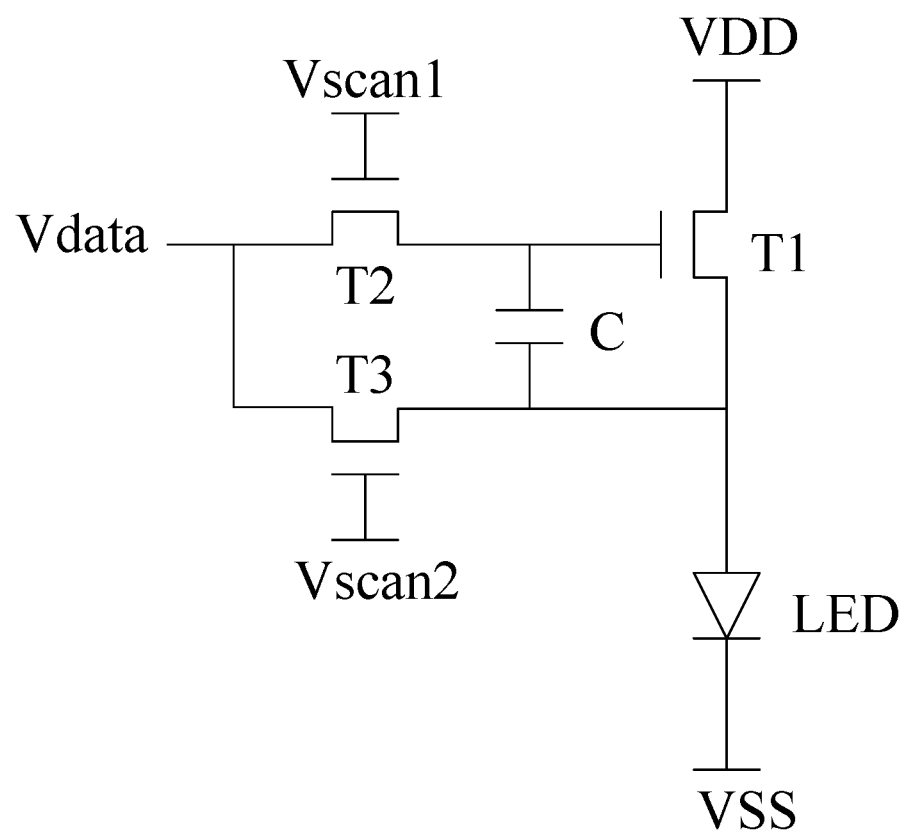
FIG. 3 is a second schematic circuit diagram of the display panel according to an embodiment of the present disclosure.

The above embodiment describes a driving circuit having two thin film transistors and one storage capacitor (2T1C) in detail, but embodiments of the present disclosure are not limited to this. The driving circuit may also be a 3T1C circuit or a 7T1C circuit. For example, as shown in FIG. 3, each of the sub-pixels includes the 3T1C circuit. Compared to the 2T1C circuit, the 3T1C circuit adds a third thin film transistor T3, and a first gate line Vscan1 and a second gate line Vscan2 control the second thin film transistor T2 and the third thin film transistor T3 to be turned on or turned off, respectively. A threshold voltage of the first thin film transistor T1 can be compensated by disposing the 3T1C circuit, thereby improving brightness uniformity of the display panel.

In an embodiment, as shown in FIG. 1, the display panel further includes a substrate 11, the low temperature polysilicon thin film transistor 31 includes a first active layer 13 disposed on the substrate 11, the first gate electrode 15 is disposed on one side of the first active layer 13 away from the substrate 11, the first source electrode 231 and the first drain electrode 232 are disposed on the side of the first active layer 13 away from the substrate 11, and the first source electrode 231 and the first drain electrode 232 are connected to the first active layer 13. When disposing the low temperature polysilicon thin film transistor, a gate electrode and source and drain electrodes of the low temperature polysilicon thin film transistor may be disposed on a same side of the first active layer, and the stability of the oxide thin film transistor can be improved by disposing source and drain electrodes of the oxide thin film transistor and the source and drain electrodes of the low temperature polysilicon thin film transistor in the same layer.

In an embodiment, the low temperature polysilicon thin film transistor includes the first active layer disposed on the substrate, the first gate electrode is disposed on one side of the first active layer adjacent to the substrate, the first source electrode and the first drain electrode are disposed on the side of the first active layer away from the substrate, and the first source electrode and the first drain electrode are connected to the first active layer. When disposing the low temperature polysilicon thin film transistor, the gate electrode and the source and drain electrodes of the low temperature polysilicon thin film transistor may also be disposed on both sides of the first active layer, the embodiments of the present disclosure are not limited to this, and disposition positions of the gate electrode and the source and drain electrodes of the low temperature polysilicon thin film transistor may be determined according to needs.

In display panels using the low temperature polysilicon thin film transistor and the oxide thin film transistor, the oxide thin film transistor having the gate electrode and the source and drain electrodes disposed on a same side of an active layer and back-channel etching type oxide thin film transistors have a problem of oxides having unstable properties. In an embodiment, as shown in FIG. 1, the oxide thin film transistor 32 includes a second active layer 18 disposed on the substrate 11, the second gate electrode 20 is disposed on one side of the second active layer 18 away from the substrate 11, the second source electrode 233 and the second drain electrode 234 are disposed under the second active layer 18, and the second gate electrode 20 is disposed on the side of the second active layer 18 away from the second source electrode 233.

The embodiment of the present disclosure reduces the process steps by disposing the source and drain electrodes of the low temperature polysilicon thin film transistor and the oxide thin film transistor on the same layer, thereby reducing a probability of the oxide thin film transistor being affected during a manufacturing process, thereby improving stability of devices and shortening a channel of the oxide thin film transistor. In addition, an area of an overlapping portion of the second source electrode and the second drain electrode with the second gate electrode can be increased by respectively disposing the second gate electrode and the second source electrode and the second drain electrode on both sides of the second active layer, thereby reducing a size of the oxide thin film transistor, reducing bezels, and improving the resolution of the display panel.

In an embodiment, the display panel further includes:
a first insulating layer disposed on the first source electrode and the first drain electrode; and
a second insulating layer disposed on the second source electrode and the second drain electrode;
wherein, the first insulating layer and the second insulating layer are separately provided. When disposing the low temperature polysilicon thin film transistor and the oxide thin film transistor, disposing the first insulating layer on the first source electrode and the first drain electrode and disposing the second insulating layer on the second source electrode and the second drain electrode are required, thereby preventing a problem of short circuits. When disposing the first insulating layer and the second insulating layer, the first insulating layer and the second insulating layer may be separately provided, thereby preventing metal layers in the display panel from having short circuits.

In an embodiment, as shown in FIG. 1, the display panel further includes:
a first gate insulating layer 14 disposed on the side of the first active layer 13 away from the substrate 11;
a first gate electrode layer 15 disposed on one side of the first gate insulating layer 14 away from the first active layer 13, wherein, the first gate electrode layer 15 includes the first gate electrode 15 (the first gate electrode layer and the first gate electrode use a same reference number 15);
an interlayer insulating layer 16 disposed on one side of the first gate electrode layer 15 away from the first gate insulating layer 14;
a source and drain electrode layer 23 disposed on one side of the interlayer insulating layer 16 away from the first gate electrode layer 15;

a first passivation layer 17 disposed on one side of the source and drain electrode layer 23 away from the interlayer insulating layer 16;

the second active layer 18 disposed on one side of the first passivation layer 17 away from the source and drain electrode layer 23;

a second gate insulating layer 19 disposed on one side of the second active layer 18 away from the first passivation layer 17;

a second gate electrode layer 20 disposed on one side of the second gate insulating layer 19 away from the second active layer 18, wherein, the second gate electrode layer 20 includes the second gate electrode 20 and the gate lines (the second gate electrode layer and the second gate electrode use a same reference number 20); and a second passivation layer 21 disposed on one side of the second gate electrode layer 20 away from the second gate insulating layer 19;

wherein, the source and drain electrode layer 23 includes the first source electrode 231, the first drain electrode 232, the second source electrode 233, the second drain electrode 234, and the data lines. Specifically, the source and drain electrode layer is patterned to obtain the first source electrode, the first drain electrode, the second source electrode, and the second drain electrode, which allows the source and drain electrodes of the low temperature polysilicon thin film transistor and the source and drain electrodes of the oxide thin film transistor to be all disposed in the source and drain electrode layer, thereby reducing the process steps of the display panel. The source and drain electrodes of the low temperature polysilicon thin film transistor and the source and drain electrodes of the oxide thin film transistor can be formed by performing only one process on the source and drain electrode layer, thereby improving stability of the oxide thin film transistor.

Regarding a problem of the display panel having more processes caused by the low temperature polysilicon thin film transistor and the oxide thin film transistor having separately disposed insulating layers, thereby affecting the stability of the oxide thin film transistor, a following embodiment can solve this problem. In an embodiment, as shown in FIG. 1, the first passivation layer 17 is disposed on the first source electrode 231 and the first drain electrode 232 and extends above the second source electrode 233 and the second drain electrode 234. That is, a passivation layer on the low temperature polysilicon thin film transistor and an interlayer insulating layer of the oxide thin film transistor are replaced by the first passivation layer. Therefore, in the manufacturing process of the display panel, the process steps can be further reduced, thereby further improving the stability of the oxide thin film transistor. In addition, the first passivation layer is used as the passivation layer on the low temperature polysilicon thin film transistor and the interlayer insulating layer of the oxide thin film transistor at a same time, so the thickness of the display panel can be reduced.

Regarding the size of the oxide thin film transistor being larger, thereby causing the resolution of the display panel to be unable to be improved, a following embodiment can solve this problem. In an embodiment, a projection of the second gate electrode on the substrate and a projection of the second source electrode and the second drain electrode on the substrate have the overlapping portion, and the area of the overlapping portion is greater than or equal to a threshold value. The second gate electrode and the second source electrode and the second drain electrode are respectively disposed on both sides of the second active layer, and the source and drain electrode layer is disposed on a bottom of the second active layer, so the overlapping portion between the second gate electrode and the second source electrode and the second drain electrode can be increased, thereby reducing the size of the oxide thin film transistor correspondingly, improving the resolution of the display panel.

Specifically, the threshold value is 2 μm, but the embodiments of the present disclosure are not limited to this. When the stability of the oxide thin film transistor is not affected, the threshold value may be set according to needs.

In an embodiment, the pixel capacitor includes a first electrode plate and a second electrode plate, the first electrode plate and the first gate electrode are disposed in a same layer, and the second electrode plate and the second gate electrode are disposed in another same layer. When forming the pixel capacitor, electrode plates of the pixel capacitor can be respectively formed by the first gate electrode layer and the second gate electrode layer, so there is no need to add other film layers when forming the pixel capacitor, thereby reducing the thickness of the display panel.

In an embodiment, the pixel capacitor includes the first electrode plate and the second electrode plate, the first electrode plate and the second source electrode are disposed in a same layer, and the second electrode plate and the second gate electrode are disposed in another same layer. By respectively disposing the first electrode plate and the second electrode plate of the pixel capacitor in the source and drain electrode layer and the second gate electrode layer, there is no need to add other film layers when forming the pixel capacitor, thereby reducing the thickness of the display panel.

In an embodiment, as shown in FIG. 1, the display panel further includes a buffer layer 12 disposed between the substrate 11 and the first active layer 13.

In an embodiment, a material of the buffer layer includes silicon oxide, silicon nitride, silicon oxynitride, a laminate of silicon oxide and silicon nitride, or a mixed material.

In an embodiment, a material of the first active layer includes polysilicon. The polysilicon is obtained by laser annealing crystallization of amorphous silicon or other crystallization methods.

In an embodiment, a material of the first gate insulating layer includes silicon oxide, silicon nitride, aluminum oxide, the laminate of silicon oxide and silicon nitride, or the mixed material.

In an embodiment, a material of the first gate electrode layer includes molybdenum, a laminate of molybdenum/aluminum, a laminate of molybdenum/copper, a laminate of molybdenum-titanium alloy/copper, a laminate of titanium/aluminum/titanium, a laminate of titanium/copper/titanium, a laminate of molybdenum/copper/indium zinc oxide, a laminate of indium zinc oxide/copper/indium zinc oxide, a laminate of molybdenum/copper/indium tin oxide, a laminate of nickel/copper/nickel, a laminate of molybdenum-nickel-titanium alloy/copper/molybdenum-nickel-titanium alloy, nickel-chromium alloy/copper/nickel-chromium alloy, titanium-nickel alloy/copper/titanium-nickel alloy, a laminate of titanium-chromium alloy/copper/titanium-chromium alloy, or niobium-copper alloy.

In an embodiment, the low temperature polysilicon thin film transistor includes N-type transistors and P-type transistors.

In an embodiment, a material of the interlayer insulating layer includes silicon oxide, silicon nitride, or silicon oxynitride.

In an embodiment, a material of the source and drain electrode layer includes molybdenum, the laminate of molybdenum/aluminum, the laminate of molybdenum/copper, the laminate of molybdenum-titanium alloy/copper, a laminate of molybdenum-titanium alloy/copper/molybdenum-titanium alloy, the laminate of titanium/aluminum/titanium, the laminate of titanium/copper/titanium, the laminate of molybdenum/copper/indium zinc oxide, the laminate of indium zinc oxide/copper/indium zinc oxide, the laminate of molybdenum/copper/indium tin oxide, the laminate of nickel/copper/nickel, the laminate of molybdenum-nickel-titanium alloy/copper/molybdenum-nickel-titanium alloy, nickel-chromium alloy/copper/nickel-chromium alloy, titanium-nickel alloy/copper/titanium-nickel alloy, the laminate of titanium-chromium alloy/copper/titanium-chromium alloy, or niobium-copper alloy.

In an embodiment, a material of the first passivation layer includes silicon oxide, a laminate of silicon oxide/silicon nitride, or a laminate of aluminum oxide/silicon oxide.

In an embodiment, a material of the second active layer includes indium gallium zinc oxide, indium gallium tin oxide, indium gallium oxide, indium zinc oxide, zinc aluminum oxide, or zinc aluminum tin oxide.

In an embodiment, a material of the second gate insulating layer includes silicon oxide, silicon nitride, aluminum oxide, the laminate of silicon oxide and silicon nitride, or the mixed material.

In an embodiment, a material of the second gate electrode layer includes molybdenum, the laminate of molybdenum/aluminum, the laminate of molybdenum/copper, the laminate of molybdenum-titanium alloy/copper, the laminate of titanium/aluminum/titanium, the laminate of titanium/copper/titanium, the laminate of molybdenum/copper/indium zinc oxide, the laminate of indium zinc oxide/copper/indium zinc oxide, the laminate of molybdenum/copper/indium tin oxide, the laminate of nickel/copper/nickel, the laminate of molybdenum-nickel-titanium alloy/copper/molybdenum-nickel-titanium alloy, nickel-chromium alloy/copper/nickel-chromium alloy, titanium-nickel alloy/copper/titanium-nickel alloy, the laminate of titanium-chromium alloy/copper/titanium-chromium alloy, or niobium-copper alloy.

In an embodiment, a material of the second passivation layer includes silicon oxide, the laminate of silicon oxide/silicon nitride, or the laminate of aluminum oxide/silicon oxide.

In an embodiment, as shown in FIG. 1, the display panel further includes a pixel electrode 22.

In an embodiment, a material of the pixel electrode includes indium tin oxide, indium zinc oxide, a laminate of indium tin oxide/silver/indium tin oxide, a laminate of indium zinc oxide/silver/indium tin oxide, a laminate of molybdenum and copper, or the laminate of molybdenum-titanium alloy/copper/molybdenum-titanium alloy.

Figure 4:
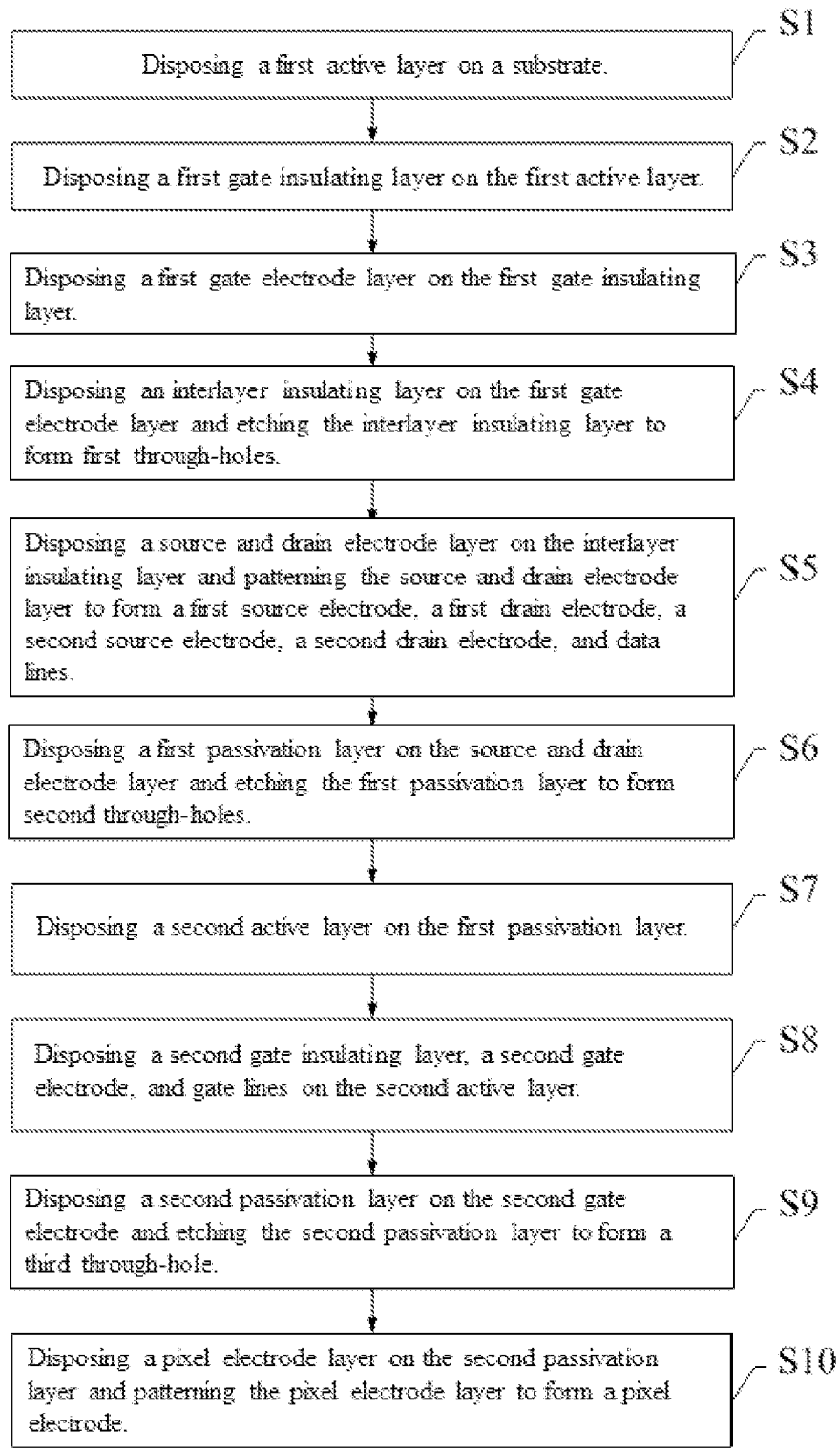
FIG. 4 is a flowchart of a manufacturing method of the display panel according to an embodiment of the present disclosure.
Figure 5:
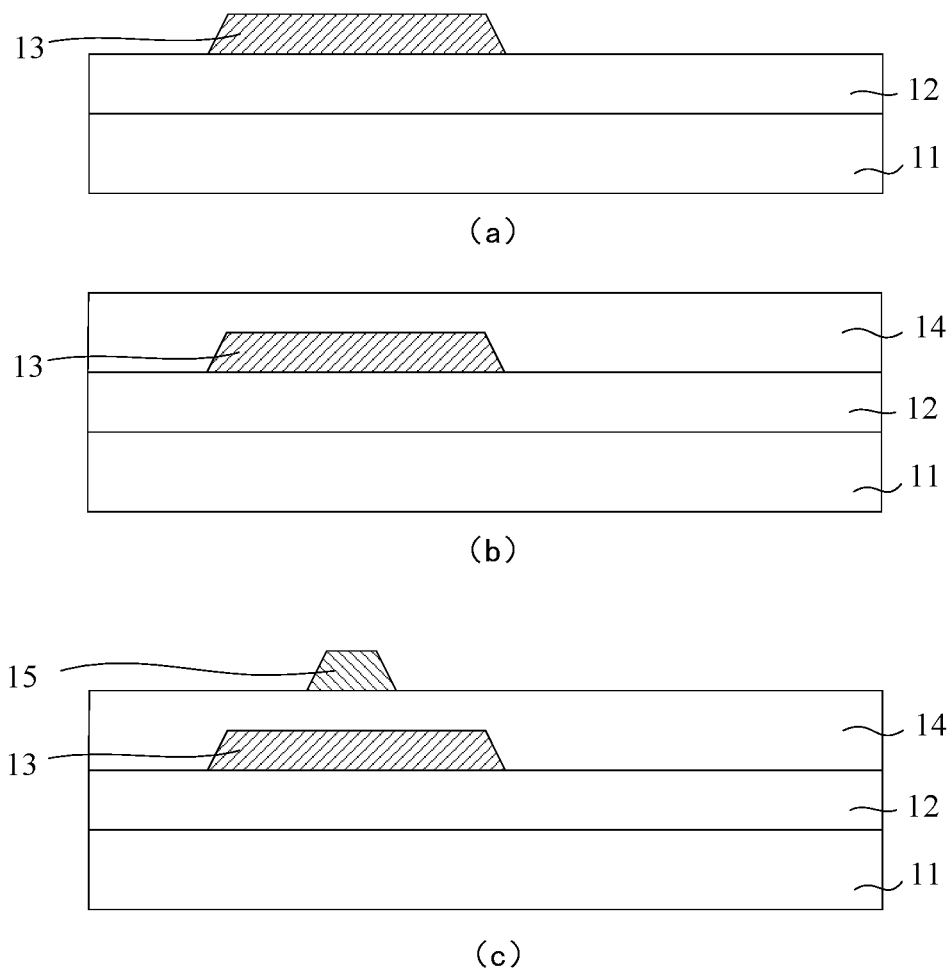
FIG. 5 is a first schematic diagram of the display panel corresponding to each step of the manufacturing method of the display panel according to an embodiment of the present disclosure.

As shown in FIG. 4, an embodiment of the present disclosure provides a manufacturing method of the display panel. The manufacturing method of the display panel includes following steps:

S1: disposing the first active layer on the substrate. A structure of the display panel is shown in FIG. 5(a).

S2: Disposing the first gate insulating layer on the first active layer. The structure of the display panel is shown in FIG. 5(b).

S3: Disposing the first gate electrode layer on the first gate insulating layer, wherein, the first gate electrode layer includes the first gate electrode. The structure of the display panel is shown in FIG. 5(c).

S4: Disposing the interlayer insulating layer on the first gate electrode layer and etching the interlayer insulating layer to form first through-holes. The structure of the display panel is shown in FIG. 6(a).

Figure 6:
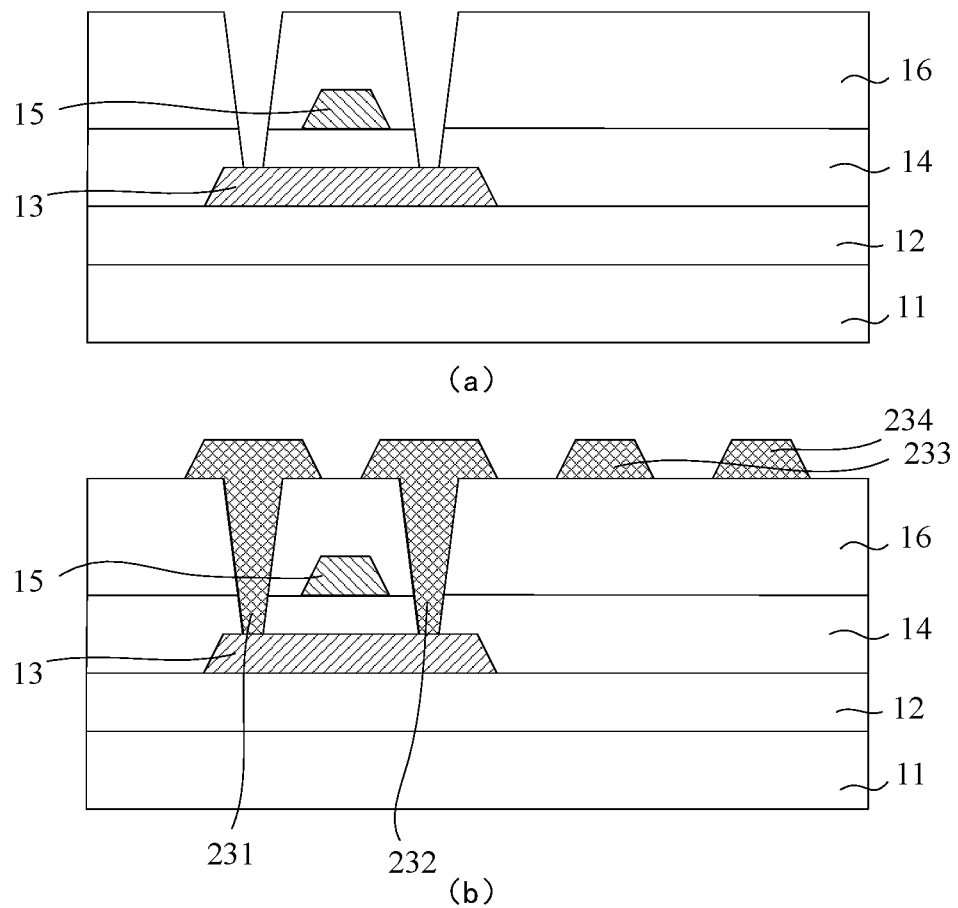
FIG. 6 is a second schematic diagram of the display panel corresponding to each step of the manufacturing method of the display panel according to an embodiment of the present disclosure.

S5: Disposing the source and drain electrode layer on the interlayer insulating layer and patterning the source and drain electrode layer to form the first source electrode, the first drain electrode, the second source electrode, the second drain electrode, and the data lines, wherein, the first source electrode and the first drain electrode are connected to the first active layer by the first through-holes. The structure of the display panel is shown in FIG. 6 (b).

Figure 7:
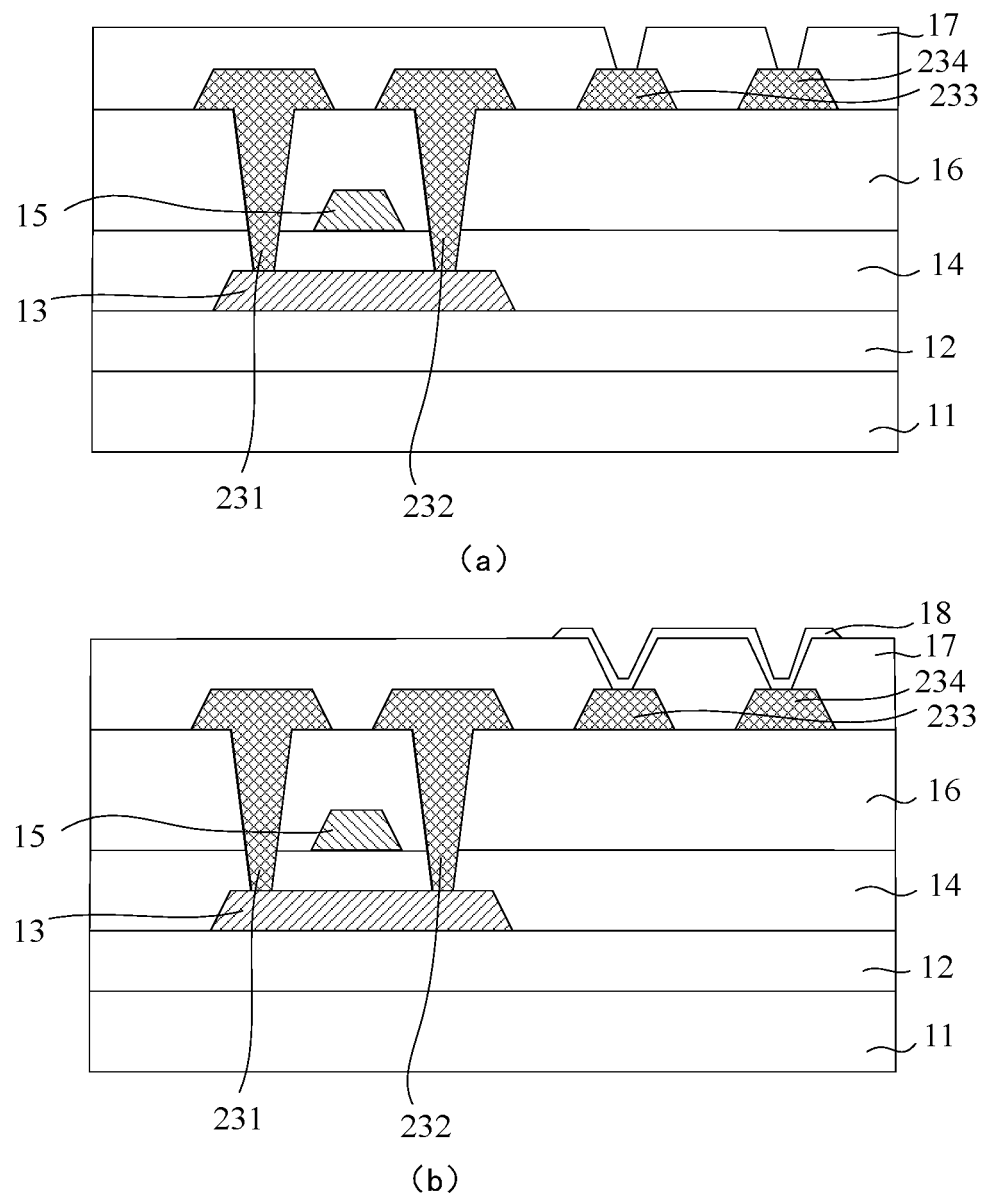
FIG. 7 is a third schematic diagram of the display panel corresponding to each step of the manufacturing method of the display panel according to an embodiment of the present disclosure.

S6: Disposing the first passivation layer on the source and drain electrode layer and etching the first passivation layer to form second through-holes. The structure of the display panel is shown in FIG. 7 (a).

S7: Disposing the second active layer on the first passivation layer, wherein, the second source electrode and the second drain electrode are connected to the second active layer by the second through-holes. The structure of the display panel is shown in FIG. 7(b).

Figure 8:
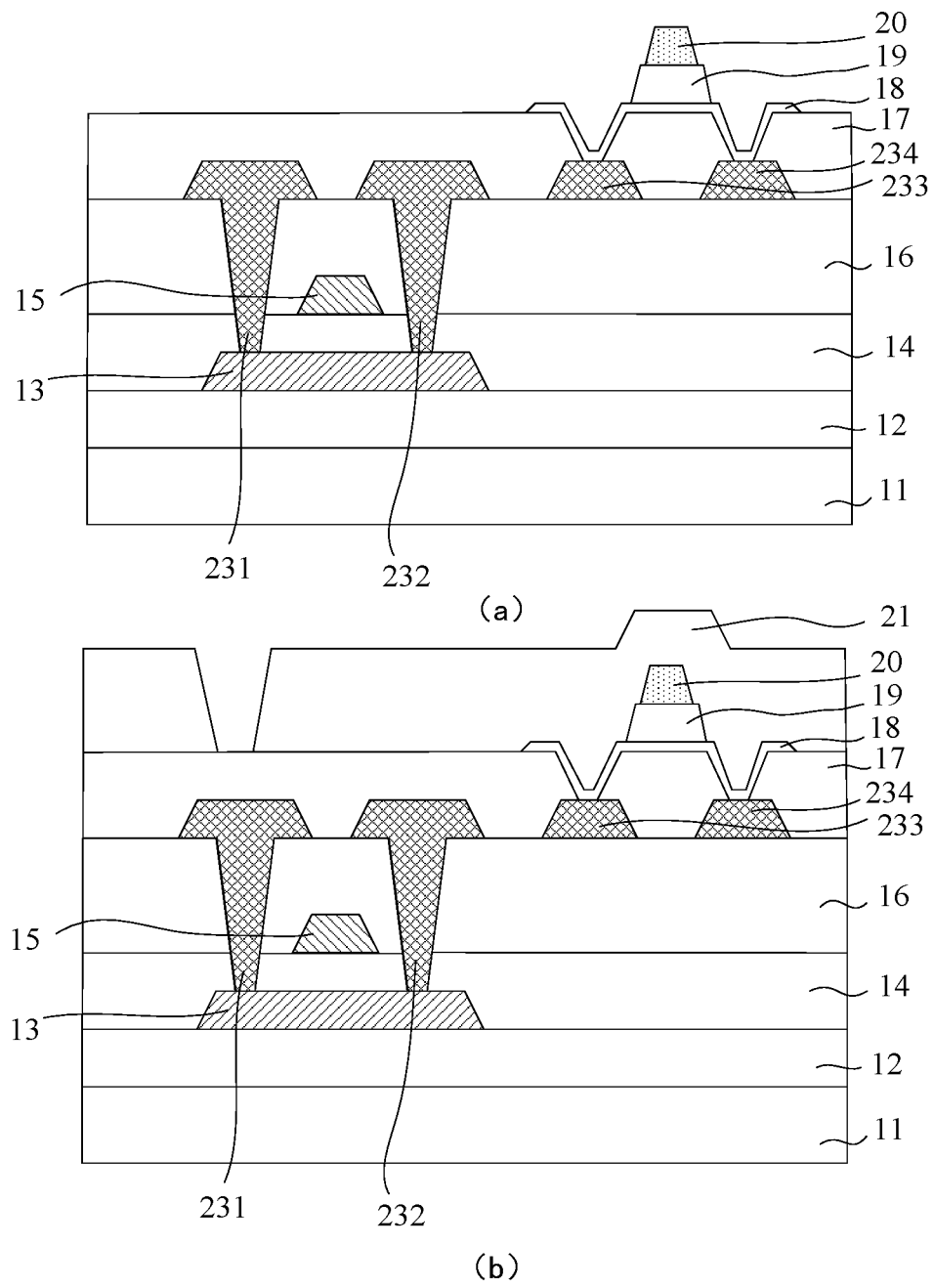
FIG. 8 is a fourth schematic diagram of the display panel corresponding to each step of the manufacturing method of the display panel according to an embodiment of the present disclosure.

S8: Disposing the second gate insulating layer, the second gate electrode, and the gate lines on the second active layer. The structure of the display panel is shown in FIG. 8 (a).

S9: Disposing the second passivation layer on the second gate electrode and etching the second passivation layer to form a third through-hole. The structure of the display panel is shown in FIG. 8(b).

S10: Disposing a pixel electrode layer on the second passivation layer and patterning the pixel electrode layer to form a pixel electrode, wherein, the pixel electrode is connected to the first source electrode by the third through-hole. The structure of the display panel is shown in FIG. 1.

The embodiment of the present disclosure provides the manufacturing method of the display panel. Patterning the source and drain electrode layer to form the first source electrode, the first drain electrode, the second source electrode, and the second drain electrode allows the source and drain electrodes of the low temperature polysilicon thin film transistor and the source and drain electrodes of the oxide thin film transistor to be disposed in the same layer, thereby reducing the process steps of the source and drain electrode layer. At a same time, a process of insulating layers is omitted by using the first passivation layer as the passivation layer of the low temperature polysilicon thin film transistor and the interlayer insulating layer of the oxide thin film transistor, thereby reducing an impact on the oxide thin film transistor. Therefore, the channel length of the oxide thin film transistor can be shortened correspondingly, the resolution of the display panel can be improved, and the display panel can be prevented from having poor display. In addition, since the first source electrode, the first drain electrode, the second source electrode, and the second drain electrode are disposed on the same layer and the first passivation layer is used as the passivation layer of the low temperature polysilicon thin film transistor and the interlayer insulating layer of the oxide thin film transistor, the thickness of the display panel can be reduced.

It can be known according to the above embodiments:

The embodiments of the present disclosure provide the display panel and the manufacturing method thereof. The display panel includes the gate lines and the data lines arranged crosswise and insulated from each other to form the plurality of sub-pixels arranged in the array. Each of the sub-pixels is at least provided with the first thin film transistor, the second thin film transistor, the pixel capacitor, the power supply terminal, and the light-emitting unit. Wherein, the first thin film transistor includes the low temperature polysilicon thin film transistor, the low temperature polysilicon thin film transistor includes the first gate electrode, the first source electrode, and the first drain electrode, the first gate electrode is connected to the pixel capacitor, and the first source electrode is connected to the power supply terminal, and the first drain electrode is connected to the light-emitting unit. The second thin film transistor includes the oxide thin film transistor, the oxide thin film transistor includes the second gate electrode, the second source electrode, and the second drain electrode, the second gate electrode is connected to the gate lines, the second source electrode is connected to the data lines, and the second drain electrode is connected to the first gate electrode. Wherein, the first source electrode, the first drain electrode, the second source electrode, and the second drain electrode are disposed in the same layer, and the first source electrode and the first drain electrode are insulated from the second source electrode and the second drain electrode. The present disclosure can reduce the process steps of the display panel when disposing the low temperature polysilicon thin film transistor and the oxide thin film transistor by disposing the first source electrode and the first drain electrode of the low temperature polysilicon thin film transistor and the second source electrode and the second drain electrode of the oxide thin film transistor in the same layer. Therefore, the stability of the oxide thin film transistor can be improved, the channel length of the oxide thin film transistor can be shortened correspondingly, the resolution of the display panel can be improved, and the display panel can be prevented from having poor display. In addition, since the first source electrode, the first drain electrode, the second source electrode, and the second drain electrode are disposed in the same layer, the thickness of the display panel can be reduced.

In the above embodiments, the description of each embodiment has its own emphasis. For the parts that are not described in detail in an embodiment, refer to the detailed description of other embodiments above.

The display panel and the manufacturing method thereof provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display panel, comprising a plurality of gate lines and data lines arranged crosswise and insulated from each other to form a plurality of sub-pixels arranged in an array, wherein each of the sub-pixels is at least provided with a first thin film transistor, a second thin film transistor, a pixel capacitor, a power supply terminal, and a light-emitting unit;

wherein the first thin film transistor comprises a low temperature polysilicon thin film transistor, the low temperature polysilicon thin film transistor comprises a first gate electrode, a first source electrode, and a first drain electrode, the first gate electrode is connected to the pixel capacitor, and the first source electrode is connected to the power supply terminal, and the first drain electrode is connected to the light-emitting unit;

the second thin film transistor comprises an oxide thin film transistor, the oxide thin film transistor comprises a second gate electrode, a second source electrode, and a second drain electrode, the second gate electrode is connected to the gate lines, the second source electrode is connected to the data lines, and the second drain electrode is connected to the first gate electrode; and the first source electrode, the first drain electrode, the second source electrode, and the second drain electrode are disposed in a same layer, and the first source electrode and the first drain electrode are insulated from the second source electrode and the second drain electrode;

wherein the display panel further comprises a substrate, the low temperature polysilicon thin film transistor comprises a first active layer disposed on the substrate, the first gate electrode is disposed on one side of the first active layer, the first source electrode and the first drain electrode are disposed on one side of the first active layer away from the substrate, and the first source electrode and the first drain electrode are connected to the first active layer;

the oxide thin film transistor comprises a second active layer disposed on the substrate, the second gate electrode is disposed on one side of the second active layer away from the substrate, the second source electrode and the second drain electrode are disposed under the second active layer, and the second gate electrode is disposed on the side of the second active layer away from the second source electrode;

wherein the display panel further comprises:

a first gate insulating layer disposed on the side of the first active layer away from the substrate;

a first gate electrode layer disposed on one side of the first gate insulating layer away from the first active layer, wherein the first gate electrode layer comprises the first gate electrode;

an interlayer insulating layer disposed on one side of the first gate electrode layer away from the first gate insulating layer;

a source and drain electrode layer disposed on one side of the interlayer insulating layer away from the first gate electrode layer;

a first passivation layer disposed on one side of the source and drain electrode layer away from the interlayer insulating layer;

the second active layer disposed on one side of the first passivation layer away from the source and drain electrode layer;

a second gate insulating layer disposed on one side of the second active layer away from the first passivation layer;

a second gate electrode layer disposed on one side of the second gate insulating layer away from the second active layer, wherein the second gate electrode layer comprises the second gate electrode and the gate lines; and a second passivation layer disposed on one side of the second gate electrode layer away from the second gate insulating layer;

wherein the source and drain electrode layer comprises the first source electrode, the first drain electrode, the second source electrode, the second drain electrode, and the data lines;

wherein the first passivation layer is disposed on the first source electrode and the first drain electrode and extends above the second source electrode and the second drain electrode.

2. The display panel according to claim 1, wherein a projection of the second gate electrode on the substrate and a projection of the second source electrode and the second drain electrode on the substrate have an overlapping portion, and an area of the overlapping portion is greater than or equal to a threshold value;
wherein the threshold value is 2 µm.

3. The display panel according to claim 1, further comprising a buffer layer disposed between the substrate and the first active layer.

4. The display panel according to claim 3, wherein a material of the buffer layer comprises silicon oxide, silicon nitride, silicon oxynitride, a laminate of silicon oxide and silicon nitride, or a mixed material.

5. The display panel according to claim 1, wherein a material of the first active layer comprises polysilicon.

6. The display panel according to claim 1, wherein a material of the first gate electrode layer comprises molybdenum, a laminate of molybdenum/aluminum, a laminate of molybdenum/copper, a laminate of molybdenum-titanium alloy/copper, a laminate of titanium/aluminum/titanium, a laminate of titanium/copper/titanium, a laminate of molybdenum/copper/indium zinc oxide, a laminate of indium zinc oxide/copper/indium zinc oxide, a laminate of molybdenum/copper/indium tin oxide, a laminate of nickel/copper/nickel, a laminate of molybdenum-nickel-titanium alloy/copper/molybdenum-nickel-titanium alloy, nickel-chromium alloy/copper/nickel-chromium alloy, titanium-nickel alloy/copper/titanium-nickel alloy, a laminate of titanium-chromium alloy/copper/titanium-chromium alloy, or niobium-copper alloy.

7. The display panel according to claim 1, wherein the low temperature polysilicon thin film transistor comprises N-type transistors and P-type transistors.

8. The display panel according to claim 1, wherein a material of the interlayer insulating layer comprises silicon oxide, silicon nitride, or silicon oxynitride.

9. The display panel according to claim 1, wherein a material of the source and drain electrode layer comprises molybdenum, a laminate of molybdenum/aluminum, a laminate of molybdenum/copper, a laminate of molybdenum-titanium alloy/copper, a laminate of molybdenum-titanium alloy/copper/molybdenum-titanium alloy, a laminate of titanium/aluminum/titanium, a laminate of titanium/copper/titanium, a laminate of molybdenum/copper/indium zinc oxide, a laminate of indium zinc oxide/copper/indium zinc oxide, a laminate of molybdenum/copper/indium tin oxide, a laminate of nickel/copper/nickel, a laminate of molybdenum-nickel-titanium alloy/copper/molybdenum-nickel-titanium alloy, nickel-chromium alloy/copper/nickel-chromium alloy, titanium-nickel alloy/copper/titanium-nickel alloy, a laminate of titanium-chromium alloy/copper/titanium-chromium alloy, or niobium-copper alloy.

10. The display panel according to claim 1, wherein a material of the first passivation layer comprises silicon oxide, a laminate of silicon oxide/silicon nitride, or a laminate of aluminum oxide/silicon oxide.

11. The display panel according to claim 1, wherein a material of the second active layer comprises indium gallium zinc oxide, indium gallium tin oxide, indium gallium oxide, indium zinc oxide, zinc aluminum oxide, or zinc aluminum tin oxide.

12. The display panel according to claim 1, wherein the pixel capacitor comprises a first electrode plate and a second electrode plate, the first electrode plate and the first gate electrode are disposed in a same layer, and the second electrode plate and the second gate electrode are disposed in another same layer.

13. The display panel according to claim 1, wherein the pixel capacitor comprises a first electrode plate and a second electrode plate, the first electrode plate and the second source electrode are disposed in a same layer, and the second electrode plate and the second gate electrode are disposed in another same layer.

* * * * *